United States Patent
Nian et al.

(10) Patent No.: US 9,870,995 B2
(45) Date of Patent: Jan. 16, 2018

(54) FORMATION OF COPPER LAYER STRUCTURE WITH SELF ANNEAL STRAIN IMPROVEMENT

(71) Applicant: Taiwan Semiconductor Manufacturing Co., Ltd., Hsinchu (TW)

(72) Inventors: Jun-Nan Nian, Tainan (TW); Shiu-Ko Jangjian, Tainan (TW); Chi-Cheng Hung, Tainan (TW); Yu-Sheng Wang, Tainan (TW); Hung-Hsu Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/743,926

(22) Filed: Jun. 18, 2015

(65) Prior Publication Data

US 2016/0372421 A1 Dec. 22, 2016

(51) Int. Cl.
| | |
|---|---|
| H01L 23/532 | (2006.01) |
| B32B 15/01 | (2006.01) |
| H01L 21/288 | (2006.01) |
| H01L 21/768 | (2006.01) |
| B32B 15/20 | (2006.01) |

(52) U.S. Cl.
CPC ........ *H01L 23/53238* (2013.01); *B32B 15/01* (2013.01); *H01L 21/2885* (2013.01); *H01L 21/76877* (2013.01)

(58) Field of Classification Search
None
See application file for complete search history.

(56) References Cited

U.S. PATENT DOCUMENTS

| | | | | |
|---|---|---|---|---|
| 5,741,626 A | * | 4/1998 | Jain | .................. G03F 7/091 |
| | | | | 216/18 |
| 5,880,018 A | * | 3/1999 | Boeck | .............. H01L 21/76807 |
| | | | | 257/E21.579 |
| 6,110,817 A | * | 8/2000 | Tsai | ........................ C25D 5/10 |
| | | | | 257/E21.175 |
| 6,123,825 A | * | 9/2000 | Uzoh | ..................... C25D 5/10 |
| | | | | 205/118 |
| 6,583,054 B2 | * | 6/2003 | Kwon | .............. H01L 21/76808 |
| | | | | 257/E21.579 |
| 6,740,221 B2 | * | 5/2004 | Cheung | .................... C25D 3/38 |
| | | | | 205/104 |
| 7,378,342 B2 | * | 5/2008 | Kirby | ................. H01L 21/76898 |
| | | | | 257/E21.597 |
| 2007/0190341 A1 | * | 8/2007 | Furuya | .................... C25D 3/38 |
| | | | | 428/446 |
| 2012/0186800 A1 | * | 7/2012 | Terao | .................. H01L 23/3735 |
| | | | | 165/185 |

\* cited by examiner

*Primary Examiner* — Seth Dumbris
(74) *Attorney, Agent, or Firm* — Maschoff Brennan

(57) ABSTRACT

A copper layer structure includes a first copper layer, a second copper layer and a carbon-rich copper layer. The second copper layer is disposed over the first copper layer. The carbon-rich copper layer is sandwiched between the first copper layer and the second copper layer. A carbon concentration of the carbon-rich copper layer is greater than a carbon concentration of the first copper layer and a carbon concentration of the second copper layer.

20 Claims, 11 Drawing Sheets

FORMATION OF COPPER LAYER STRUCTURE WITH SELF ANNEAL STRAIN IMPROVEMENT

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices. In the three-dimensional (3D) device, various interconnection layers are used to connect transistors and other devices. Currently, because copper offers lower resistivity than aluminum, and using a lower resistivity interconnecting material can decrease RC delay of the interconnection layers, and thus increasing the device speed, copper has been used as a material for fabricating the interconnection layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
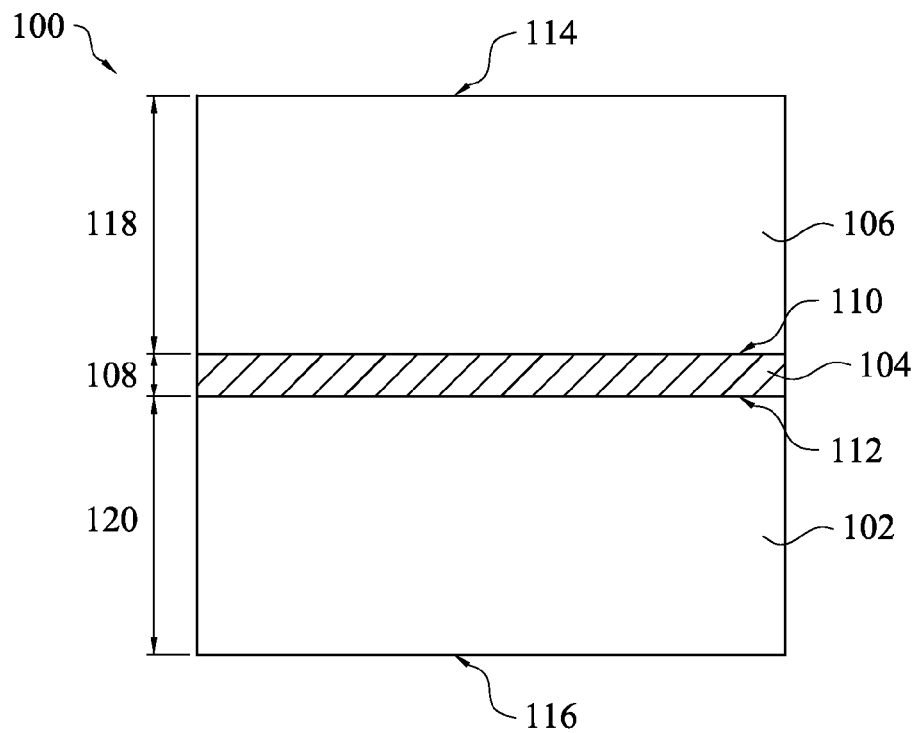
FIG. 1 is a schematic cross-sectional view of a copper layer structure in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing an integrated circuit, copper layers are usually formed in dielectric layers using an electroplating technique for electrically connecting various devices in the integrated circuit. An important feature of electroplated Cu layers is self-annealing or room-temperature recrystallization, such that copper grains in the copper layers grow to result in strain of the copper layers. Thus, hump defects are formed in top surfaces of the copper layers. In addition, when the copper grains agglomerate and grow, the volumes of the copper layers including the growing copper grains are decreased, such that a pull back phenomenon occurs and causes pit defects in the copper layers. In addition, the self-annealing of the Cu layers leads to a dramatic drop of the sheet resistance over time (referring to FIG. 2).

Embodiments of the present disclosure are directed to providing a copper layer structure and a method for forming the copper layer structure, in which at least one carbon-rich copper layer is formed in a copper main layer to divide the copper main layer into at least two copper layers. The carbon-rich copper layer between the copper layers can block or eliminate the growth of copper grains in the copper layer structure, such that strain of the copper layers is decreased, thereby preventing hump defects and pit defects from occurring.

FIG. 1 is a schematic cross-sectional view of a copper layer structure in accordance with various embodiments. In some embodiments, a copper layer structure 100 is an interconnection layer of an integrated circuit. The copper layer structure 100 may be formed using an electroplating technique. As shown in FIG. 1, the copper layer structure 100 includes a first copper layer 102, a carbon-rich copper layer 104 and a second copper layer 106. The carbon-rich copper layer 104 is disposed on the first copper layer 102. The second copper layer 106 is disposed on the carbon-rich copper layer 104, such that the second copper layer 106 is disposed over the first copper layer 102, and the carbon-rich copper layer 104 is sandwiched between the first copper layer 102 and the second copper layer 106.

A carbon concentration of the carbon-rich copper layer 104 is greater than a carbon concentration of the first copper layer 102 and a carbon concentration of the second copper layer 106. In some examples, a ratio of the carbon concentration of the carbon-rich copper layer 104 to the carbon concentration of the first copper layer 102 or the carbon concentration of the second copper layer 106 is greater than about 1.5. The carbon concentration of the first copper layer 102 may be equal to the carbon concentration of the second copper layer 106. Alternatively, the carbon concentration of the first copper layer 102 may be different from the carbon concentration of the second copper layer 106.

In some examples, the carbon-rich copper layer 104 has a thickness 108 ranging from about 50 angstrom to about 4000 angstrom. The carbon-rich copper layer 104 has a top surface 110 and a bottom surface 112 opposite to the top surface 110. In some examples, a distance 118 between the top surface 110 of the carbon-rich copper layer 104 and a top surface 114 of the second copper layer 106 is greater than or equal to about 1000 angstrom. In various examples, a distance 120 between the bottom surface 112 of the carbon-rich copper layer 104 and a bottom surface 116 of the first copper layer 102 is greater than or equal to about 1000 angstrom.

Figure 2:
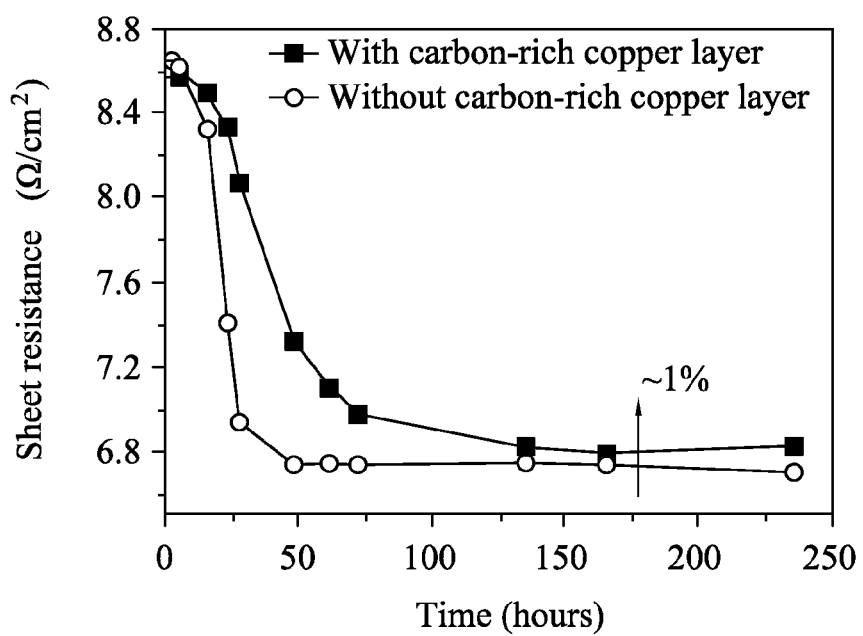
FIG. 2 is a diagram of curves respectively showing the sheet resistance of a copper layer structure over time in accordance with various embodiments and the sheet resistance of a copper layer structure with no carbon-rich copper layer over time.

Referring to FIG. 2 with FIG. 1, FIG. 2 is a diagram of curves respectively showing the sheet resistance of a copper layer structure over time in accordance with various embodiments and the sheet resistance of a copper layer structure with no carbon-rich copper layer over time. In some exemplary examples, the operation of forming the copper layer structure 100 with the carbon-rich copper layer 104 arranged between the first copper layer 102 and the second copper layer 106 includes applying a plating current 35 mA/cm$^2$ to a plating tank to form the first copper layer 102, applying a plating current 3 mA/cm$^2$ to another plating tank to form the carbon-rich copper layer 104 on the first copper layer 102, and applying a plating current 35 mA/cm$^2$ to a plating tank to form the second copper layer 106 on the carbon-rich copper layer 104. In addition, the operation of forming the copper layer structure without any carbon-rich copper layer includes applying a plating current 35 mA/cm$^2$ to a plating tank to form the copper layer structure. As illustrated in FIG. 2, it can be observed that the drop of the sheet resistance of the copper layer structure 100 is slower than that of the copper layer structure with no carbon-rich copper layer, and the impact caused by the drop of the sheet resistance on the subsequent process steps can be reduced.

Therefore, with the carbon-rich copper layer 104 disposed between the first copper layer 102 and the second copper layer 106, the growth and agglomeration of copper grains in the first copper layer 102 and the second copper layer 106 can be blocked or eliminated, such that strain of the first copper layer 102 and the second copper layer 106 is decreased, thereby preventing hump defects and pit defects from occurring in the copper layer structure 100.

Figure 3:
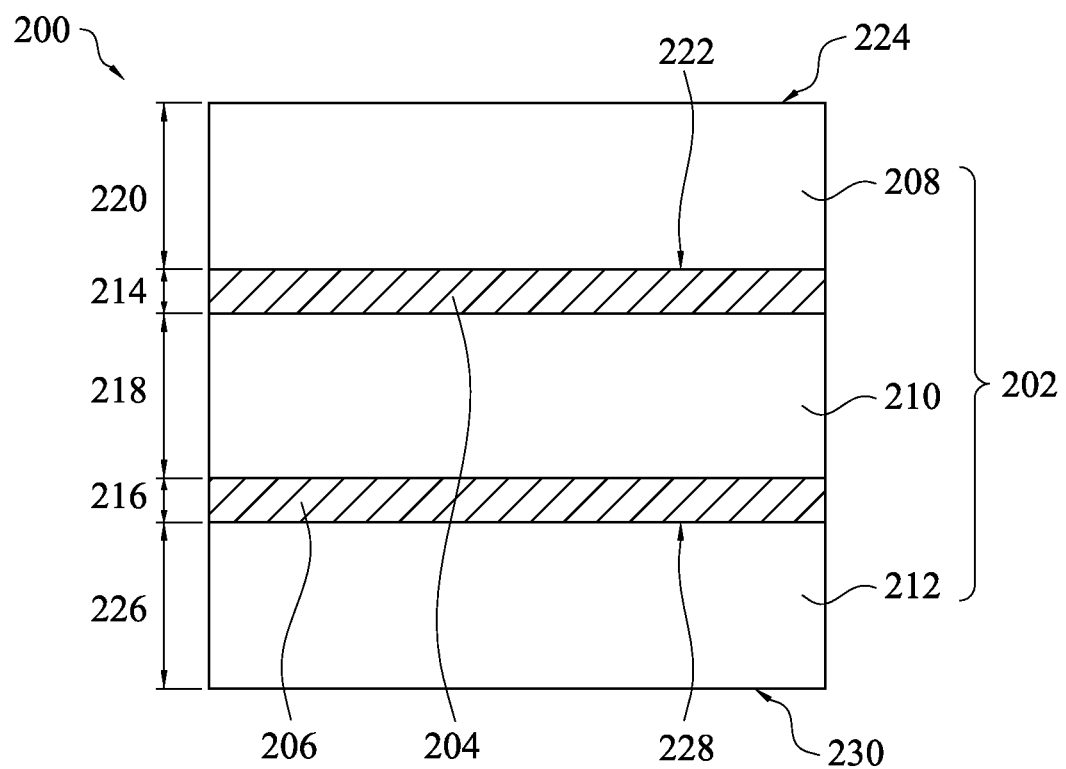
FIG. 3 is a schematic cross-sectional view of a copper layer structure in accordance with various embodiments.

FIG. 3 is a schematic cross-sectional view of a copper layer structure in accordance with various embodiments. A copper layer structure 200 may be an interconnection layer of an integrated circuit. The copper layer structure 200 may be formed using an electroplating technique. The copper layer structure 200 includes a copper main layer 202 and at least one carbon-rich copper layer. In some examples, as shown in FIG. 3, the copper layer structure 200 includes two carbon-rich copper layers 204 and 206. The carbon-rich copper layers 204 and 206 are arranged in the copper main layer 202, and the carbon-rich copper layers 204 and 206 are separated form each other, such that the carbon-rich copper layers 204 and 206 divide the copper main layer 202 into three coppers 208, 210 and 212. In some examples, the copper layer structure 200 includes only one carbon-rich copper layer, and the copper main layer 202 is divided into two copper layers by the carbon-rich copper layer. The number of the copper layers is equal to the number of the at least one carbon-rich copper layer plus one.

In the copper layer structure 200 shown in FIG. 3, the carbon-rich copper layer 206 is disposed on the copper layer 212, the copper layer 210 is disposed on the carbon-rich copper layer 206, the carbon-rich copper layer 204 is disposed on the copper layer 210, and the copper layer 208 is disposed on the carbon-rich copper layer 204. Thus, the carbon-rich copper layer 206 is arranged between the copper layers 210 and 212, and the carbon-rich copper layer 204 is arranged between the copper layers 208 and 210.

In some examples, the carbon-rich copper layer 204 has a thickness 214 ranging from about 50 angstrom to about 4000 angstrom. In addition, the carbon-rich copper layer 206 has a thickness 216 ranging from about 50 angstrom to about 4000 angstrom. The thickness 214 of the carbon-rich copper layer 204 may be equal to the thickness 216 of the carbon-rich copper layer 206. Alternatively, the thickness 214 of the carbon-rich copper layer 204 may be different from the thickness 216 of the carbon-rich copper layer 206. In some exemplary examples, a gap 218 between the carbon-rich copper layers 204 and 206 is greater than or equal to about 4000 angstrom. In some examples, a distance 220 between a top surface 222 of the carbon-rich copper layer 204, which is the top one between the carbon-rich copper layers 204 and 206, and a top surface 224 of the copper main layer 202 is greater than or equal to about 1000 angstrom. In various examples, a distance 226 between a bottom surface 228 of the carbon-rich copper layer 206, which is the lowest one between the carbon-rich copper layers 204 and 206, and a bottom surface 230 of the copper main layer 202 is greater than or equal to about 1000 angstrom.

A carbon concentration of each of the carbon-rich copper layers 204 and 206 is greater than a carbon concentration of the copper main layer 202. In some examples, a ratio of the carbon concentration of each of the carbon-rich copper layers 204 and 206 to the carbon concentration of the copper main layer 202 is greater than about 1.5. The carbon concentration of the carbon-rich copper layer 204 may be equal to the carbon concentration of the carbon-rich copper layer 206. Alternatively, the carbon concentration of the carbon-rich copper layer 204 may be different from the carbon concentration of the carbon-rich copper layer 206. In addition, the carbon concentrations of the copper layers 208, 210 and 212 may be the same or may be different from one another. In certain examples, the carbon concentrations of two of the copper layers 208, 210 and 212 are the same, and the carbon concentration of the other one of the copper layers 208, 210 and 212 is different to those of the two of the copper layers 208, 210 and 212.

With the carbon-rich copper layers 204 and 206 respectively separating the copper layer 208 from the copper layer 210 and separating the copper layer 210 from the copper layer 212, the growth and agglomeration of copper grains in the copper layers 208, 210 and 212 can be blocked or eliminated, such that strain of the copper layers 208, 210 and 212 is decreased, thereby preventing hump defects and pit defects from occurring in the copper layer structure 200.

Figure 4A:
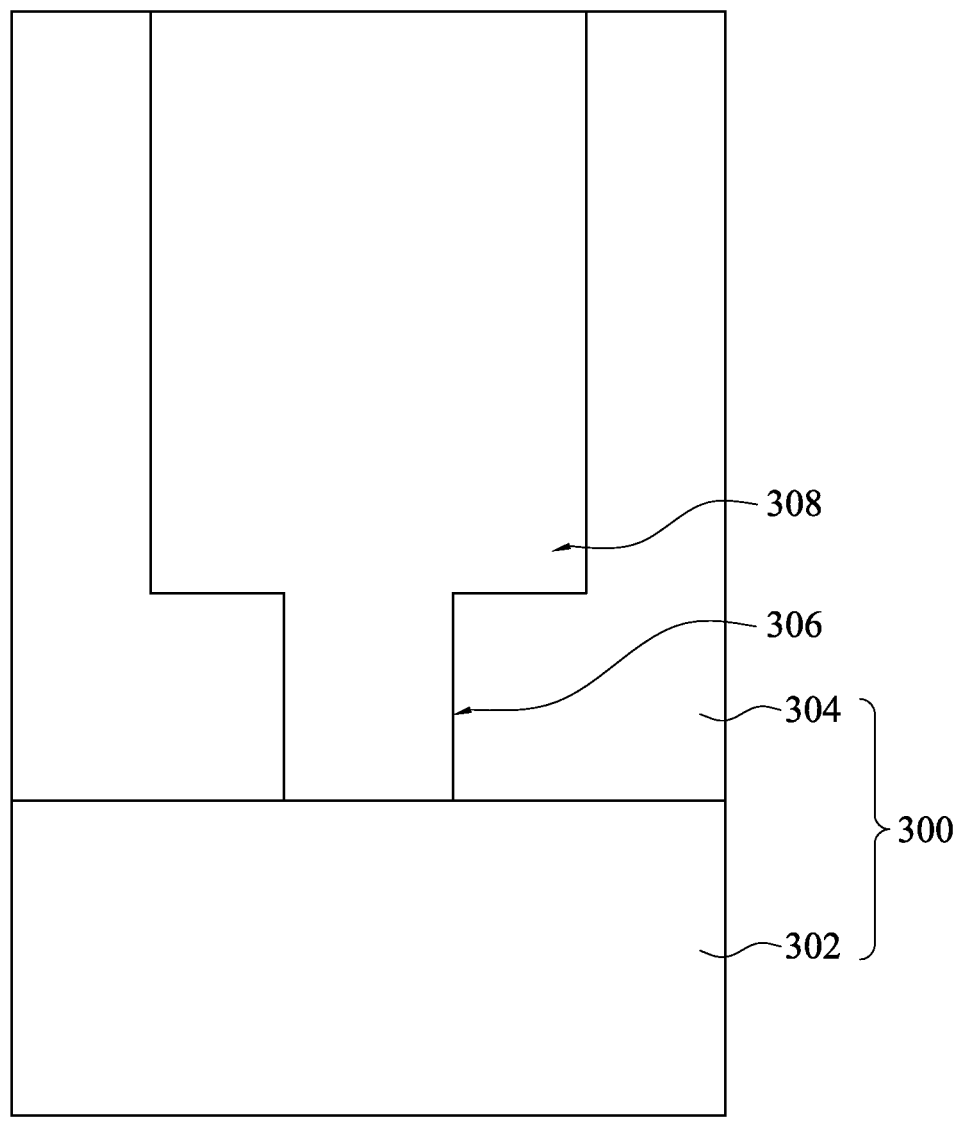
FIG. 4A through FIG. 4D are schematic cross-sectional views of intermediate stages showing a method for manufacturing a copper layer structure in accordance with various embodiments.

Referring to FIG. 4A through FIG. 4D, FIG. 4A through FIG. 4D are schematic cross-sectional views of intermediate stages showing a method for manufacturing a copper layer structure in accordance with various embodiments. As shown in FIG. 4A, a substrate 300 is provided. In some examples, the operation of providing the substrate 300 includes providing including a circuit layer 302 and a dielectric layer 304, in which the dielectric layer 304 is stacked on a surface of the circuit layer 302. For example, the dielectric layer 304 may have a via hole 306 and a trench 308 disposed over and communicating with the via hole 306. The via hole 306 and the trench 308 pass through the dielectric layer 304 to expose a portion of the surface of the circuit layer 302.

Figure 4B:
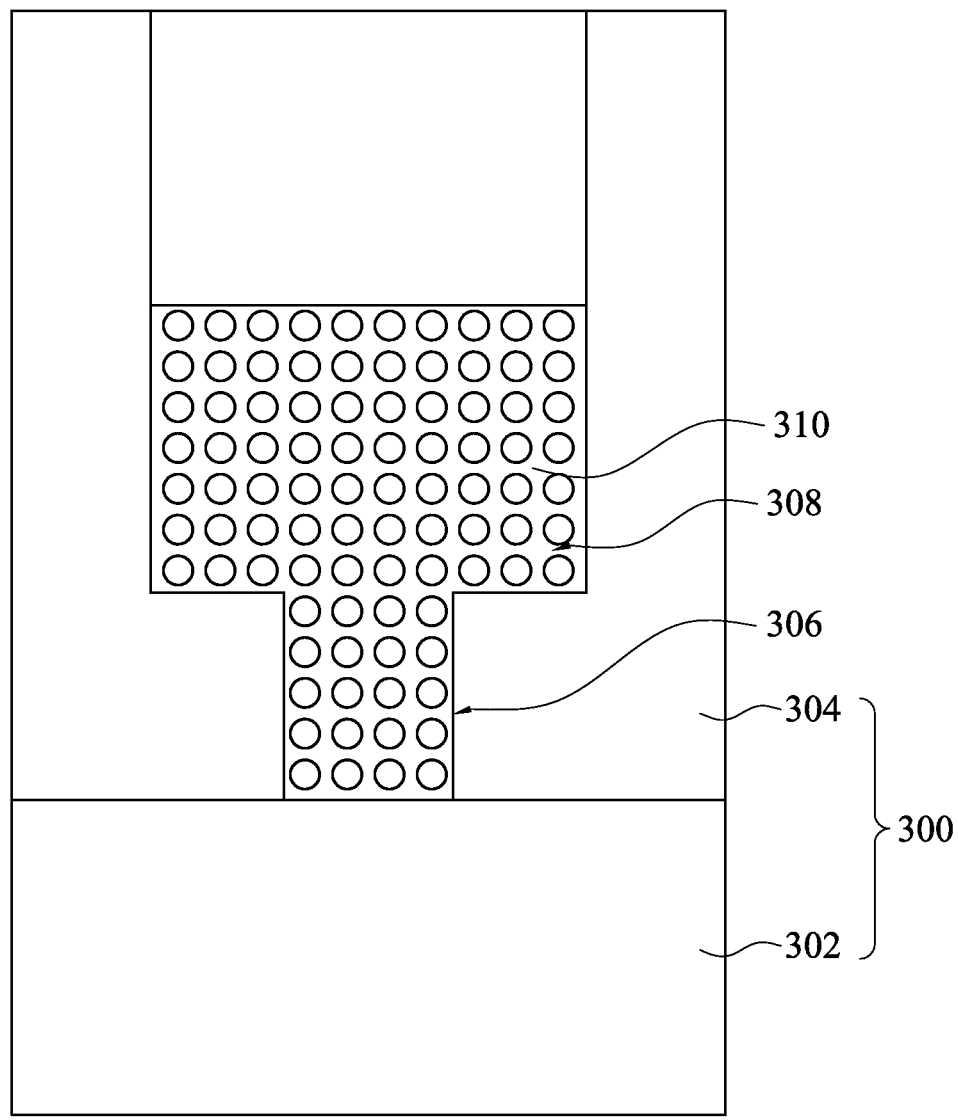

As shown in FIG. 4B, a first copper layer 310 is formed on the substrate 300 and filling into the via hole 306 and a portion of the trench 308 using, for example, an electroplating technique. In some examples, the operation of forming the first copper layer 310 includes introducing an accelerator, a suppressor and a leveling agent into a plating tank to form the first copper layer 310. In some exemplary examples, a ratio of concentrations of the accelerator, the suppressor and the leveling agent introduced in the operation of forming the first copper layer 310 is about 6:1.5:1.

Figure 4C:
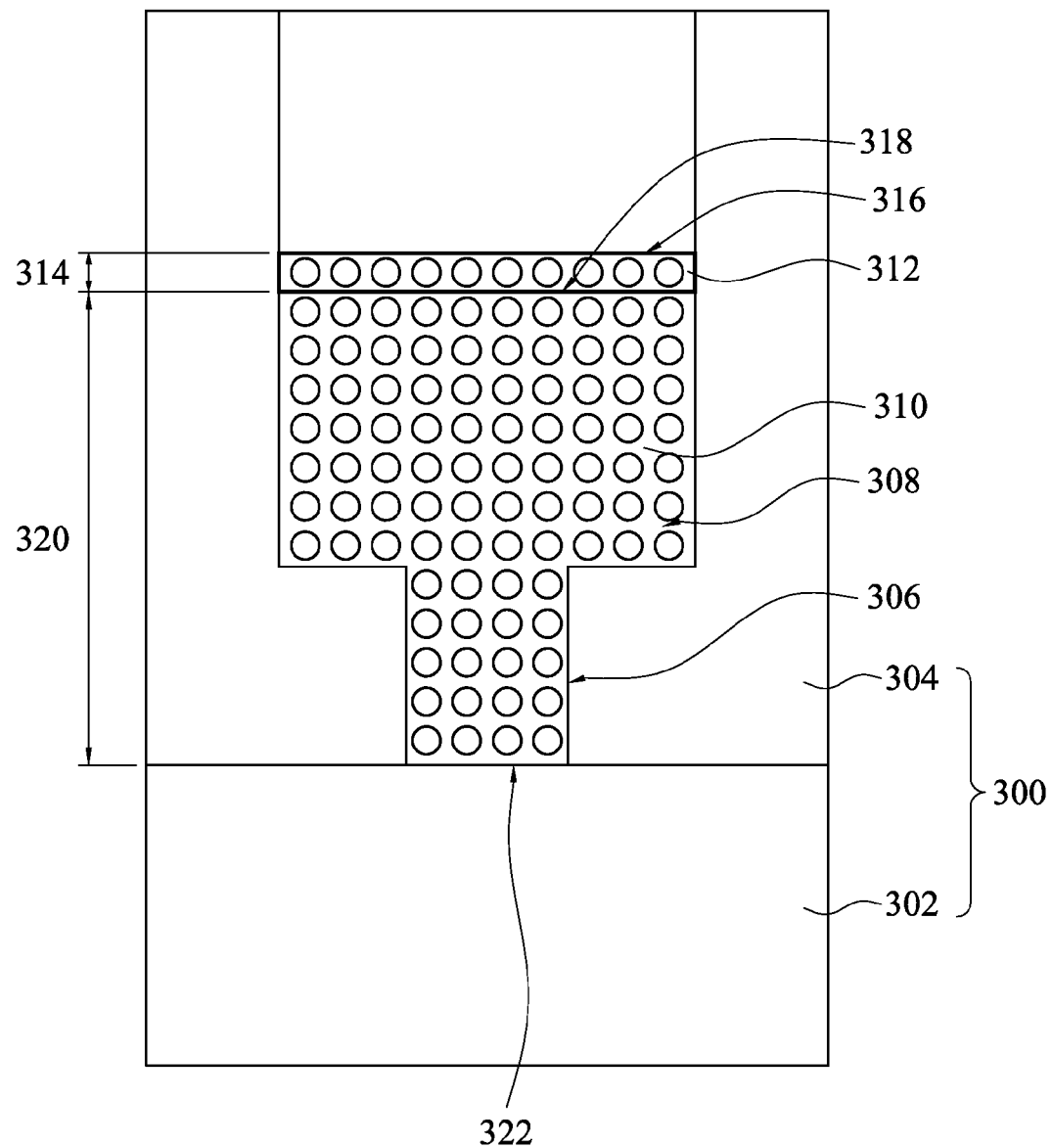

As shown in FIG. 4C, a carbon-rich copper layer 312 is formed over the first copper layer 310 and in another portion of the trench 308 using, for example, an electroplating technique. In some examples, the operation of forming the carbon-rich copper layer 312 includes introducing an accelerator, a suppressor and a leveling agent into a plating tank to form the carbon-rich copper layer 312. The accelerator, the suppressor and the leveling agent introduced in the operation of forming the carbon-rich copper layer 312 may be respectively the same as the accelerator, the suppressor and the leveling agent introduced in the operation of forming the first copper layer 310. For example, the operation of forming the carbon-rich copper layer 312 may include introducing the suppressor having a concentration ranging from about 3M to about 8M, and the leveling agent having a concentration ranging from about 2M to about 10M. In some exemplary examples, a ratio of concentrations of the accelerator, the suppressor and the leveling agent introduced in the operation of forming the carbon-rich copper layer 312 is about 6:3:2. The plating tank used to form the carbon-rich copper layer 312 may be different from the plating tank used to form the first copper layer 310.

The operation of forming the carbon-rich copper layer 312 includes forming the carbon-rich copper layer 312 having a carbon concentration greater than a carbon concentration of the first copper layer 310. In some examples, a ratio of the carbon concentration of the carbon-rich copper layer 312 to the carbon concentration of the first copper layer 310 is greater than about 1.5.

In some examples, the operation of forming the carbon-rich copper layer 312 includes forming the carbon-rich copper layer 312 having a thickness 314 ranging from about 50 angstrom to about 4000 angstrom. The operation of forming the carbon-rich copper layer 312 includes forming the carbon-rich copper layer 312 having a top surface 316 and a bottom surface 318 opposite to the top surface 316. In some exemplary examples, the bottom surface 318 of the carbon-rich copper layer 312 is spaced from a bottom surface 322 of the first copper layer 310 at a distance 320 greater than or equal to about 1000 angstrom.

Figure 4D:
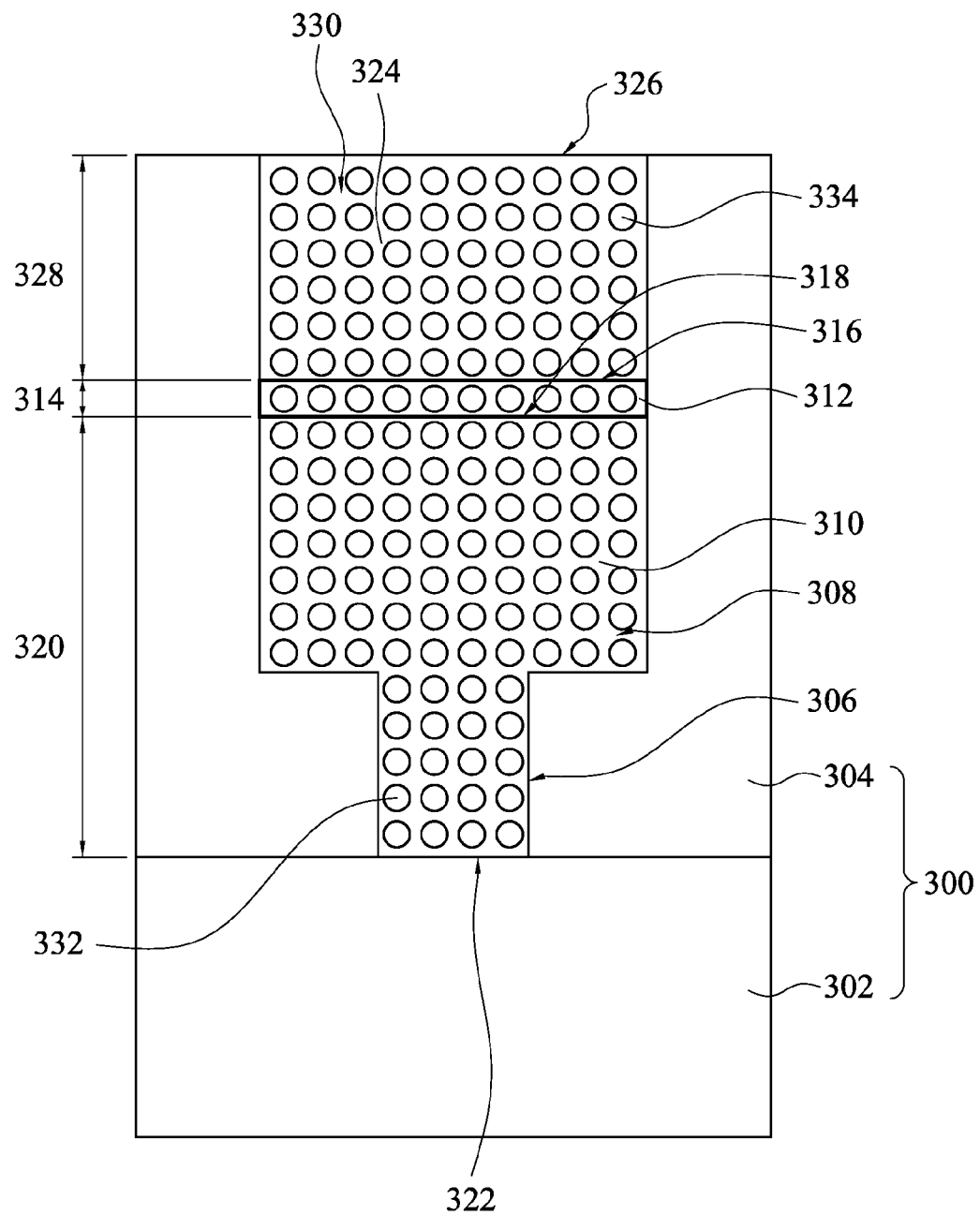

As shown in FIG. 4D, a second copper layer 324 is formed over the carbon-rich copper layer 312 and in the other portion of the trench 308 using, for example, an electroplating technique, so as to complete the formation of a copper layer structure 330. In some examples, the operation of forming the second copper layer 324 includes introducing an accelerator, a suppressor and a leveling agent into a plating tank to form the second copper layer 324. The accelerator, the suppressor and the leveling agent introduced in the operation of forming the second copper layer 324 may be respectively the same as the accelerator, the suppressor and the leveling agent introduced in the operation of forming the first copper layer 310 or the carbon-rich copper layer 312. In some exemplary examples, a ratio of concentrations of the accelerator, the suppressor and the leveling agent introduced in the operation of forming the second copper layer 324 is about 6:1.5:1. The plating tank used to form the second copper layer 324 may be the same as the plating tank used to form the first copper layer 310, and may be different from the plating tank used to form the carbon-rich copper layer 312.

The operation of forming the second copper layer 324 includes forming the second copper layer 324 having a carbon concentration smaller than the carbon concentration of the carbon-rich copper layer 312. In some examples, a ratio of the carbon concentration of the carbon-rich copper layer 312 to the carbon concentration of the second copper layer 324 is greater than about 1.5. The carbon concentration of the first copper layer 310 may be equal to the carbon concentration of the second copper layer 324. In certain examples, the carbon concentration of the first copper layer 310 may be different from the carbon concentration of the second copper layer 324. In some exemplary examples, the operation of forming the second copper layer 324 includes forming the second copper layer 324 having a top surface 326 which is spaced from the top surface 316 of the carbon-rich copper layer 312 at a distance 328 greater than or equal to about 1000 angstrom.

With the carbon-rich copper layer 312 separating the first copper layer 310 from the second copper layer 324, the growth and agglomeration of copper grains 332 in the first copper layer and copper grains 334 in the second copper layer 324 can be blocked or eliminated, such that strain of the first copper layer 310 and the second copper layer 324 is decreased, thereby preventing hump defects and pit defects from occurring in the copper layer structure 330.

Figure 5:
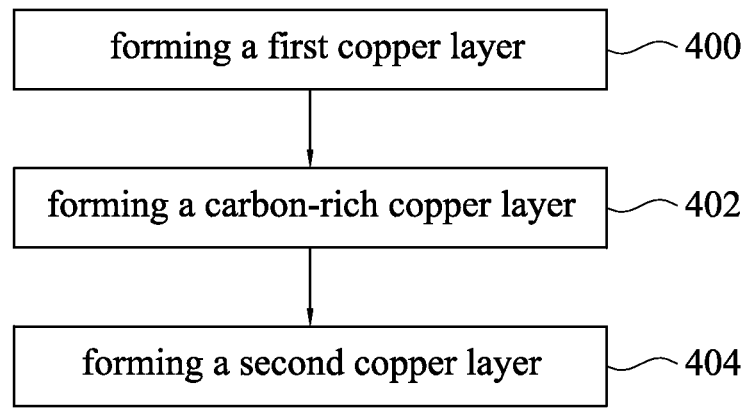
FIG. 5 is a flow chart of a method for manufacturing a semiconductor device in accordance with various embodiments.

Referring to FIG. 5 with FIG. 4A through FIG. 4D, FIG. 5 is a flow chart of a method for manufacturing a semiconductor device in accordance with various embodiments. The method begins at operation 400, where a substrate 300 is provided. As shown in FIG. 4A, a substrate 300 is provided. In some examples, the substrate 300 includes a circuit layer 302 and a dielectric layer 304 stacked on a surface of the circuit layer 302. For example, the dielectric layer 304 may has a via hole 306 and a trench 308 disposed over and communicating with the via hole 306. The via hole 306 and the trench 308 pass through the dielectric layer 304 to expose a portion of the surface of the circuit layer 302. As shown in FIG. 4B, a first copper layer 310 is formed on the substrate 300 and filling into the via hole 306 and a portion of the trench 308 using, for example, an electroplating technique. In some examples, the operation of forming the first copper layer 310 includes introducing an accelerator, a suppressor and a leveling agent into a plating tank to form the first copper layer 310. For example, a ratio of concentrations of the accelerator, the suppressor and the leveling agent introduced in the operation of forming the first copper layer 310 may be about 6:1.5:1.

At operation 402, as shown in FIG. 4C, a carbon-rich copper layer 312 is formed over the first copper layer 310 and in another portion of the trench 308 using, for example, an electroplating technique. In some examples, the operation of forming the carbon-rich copper layer 312 includes introducing an accelerator, a suppressor and a leveling agent into a plating tank to form the carbon-rich copper layer 312. The accelerator, the suppressor and the leveling agent introduced in the operation of forming the carbon-rich copper layer 312 may be respectively the same as the accelerator, the suppressor and the leveling agent introduced in the operation of forming the carbon-rich copper layer 312. For example, the operation of forming the carbon-rich copper layer 312 may include introducing the suppressor having a concentration ranging from about 3M to about 8M, and the leveling agent having a concentration ranging from about 2M to about 10M. In some exemplary examples, a ratio of concentrations of the accelerator, the suppressor and the leveling agent introduced in the operation of forming the carbon-rich copper layer 312 is about 6:3:2.

The operation of forming the carbon-rich copper layer 312 includes forming the carbon-rich copper layer 312 having a carbon concentration greater than a carbon concentration of the first copper layer 310. For example, a ratio of the carbon concentration of the carbon-rich copper layer 312 to the carbon concentration of the first copper layer 310 may be greater than about 1.5. In some examples, the operation of forming the carbon-rich copper layer 312 includes forming the carbon-rich copper layer 312 having a thickness 314 ranging from about 50 angstrom to about 4000 angstrom. In some exemplary examples, the operation of forming the carbon-rich copper layer 312 includes forming the carbon-rich copper layer 312 having a bottom surface 318 which is spaced from a bottom surface 322 of the first copper layer 310 at a distance 320 greater than or equal to about 1000 angstrom.

At operation 404, as shown in FIG. 4D, a second copper layer 324 is formed over the carbon-rich copper layer 312 and in the other portion of the trench 308 using, for example, an electroplating technique, so as to complete the formation of a copper layer structure 330. In some examples, the operation of forming the second copper layer 324 includes introducing an accelerator, a suppressor and a leveling agent into a plating tank to form the second copper layer 324. The accelerator, the suppressor and the leveling agent introduced in the operation of forming the second copper layer 324 may be respectively the same as the accelerator, the suppressor and the leveling agent introduced in the operation of forming the first copper layer 310 or the carbon-rich copper layer 312. In some exemplary examples, a ratio of concentrations of the accelerator, the suppressor and the leveling agent introduced in the operation of forming the second copper layer 324 is about 6:1.5:1. The plating tank used to form the second copper layer 324 may be the same as or may be different from the plating tank used to form the first copper layer 310.

The operation of forming the second copper layer 324 includes forming the second copper layer 324 having a carbon concentration smaller than the carbon concentration of the carbon-rich copper layer 312. In some examples, a ratio of the carbon concentration of the carbon-rich copper layer 312 to the carbon concentration of the second copper layer 324 may be greater than about 1.5. The carbon concentration of the first copper layer 310 may be equal to the carbon concentration of the second copper layer 324. Alternatively, the carbon concentration of the first copper layer 310 may be different from the carbon concentration of the second copper layer 324. In some exemplary examples, the operation of forming the second copper layer 324 includes forming the second copper layer 324 having a top surface 326 which is spaced from a top surface 316 of the carbon-rich copper layer 312 at a distance 328 greater than or equal to about 1000 angstrom.

Figure 6A:
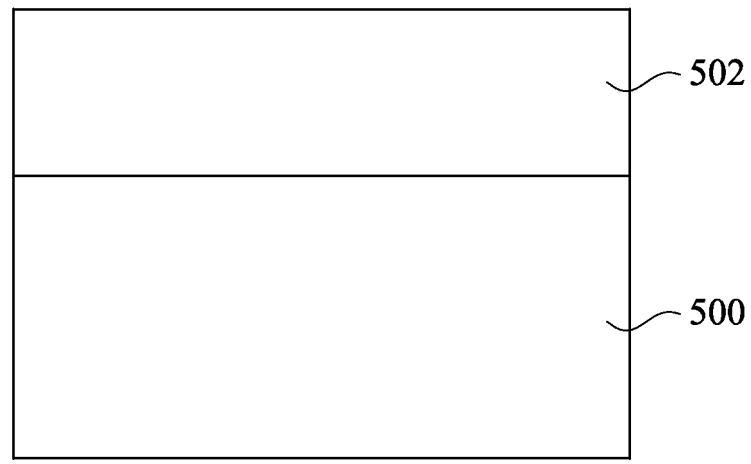
FIG. 6A through FIG. 6E are schematic cross-sectional views of intermediate stages showing a method for manufacturing a copper layer structure in accordance with various embodiments.

Referring to FIG. 6A through FIG. 6E, FIG. 6A through FIG. 6E are schematic cross-sectional views of intermediate stages showing a method for manufacturing a copper layer structure in accordance with various embodiments. As shown in FIG. 6A, a substrate 500 is provided. For example, the substrate 500 may be a semiconductor substrate, such as a silicon substrate. The substrate 500 may be a multi-layered structure including various circuit layers. A first copper layer 502 is formed on the substrate 500 using, for example, an electroplating technique. In some examples, the operation of forming the first copper layer 502 includes introducing an accelerator, a suppressor and a leveling agent into a plating tank to form the first copper layer 310. For example, a ratio of concentrations of the accelerator, the suppressor and the leveling agent introduced in the operation of forming the first copper layer may be about 6:1.5:1.

Figure 6B:
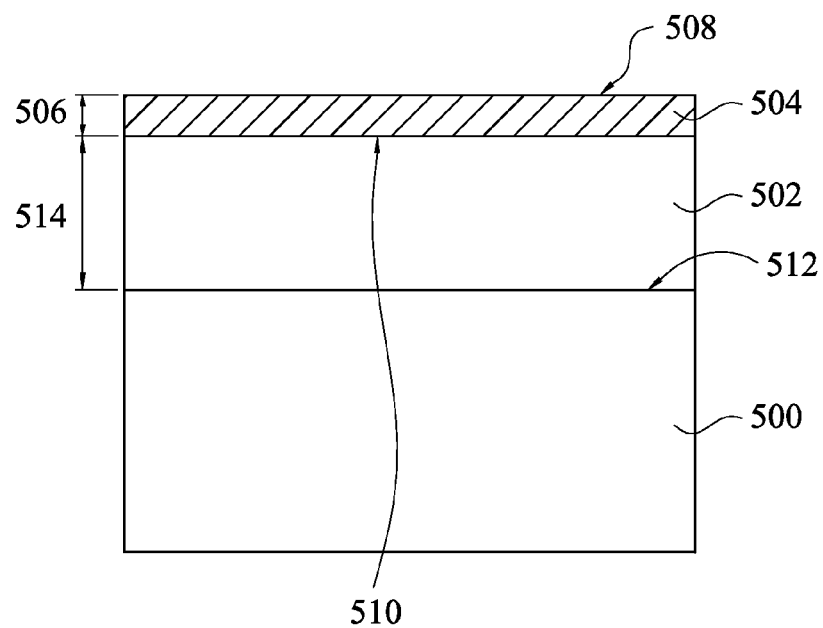

As shown in FIG. 6B, a first carbon-rich copper layer 504 is formed over the first copper layer 502 using, for example, an electroplating technique. In some examples, the operation of forming the first carbon-rich copper layer 504 includes introducing an accelerator, a suppressor and a leveling agent into a plating tank to form the first carbon-rich copper layer 504. The accelerator, the suppressor and the leveling agent introduced in the operation of forming the first carbon-rich copper layer 504 may be respectively the same as the accelerator, the suppressor and the leveling agent introduced in the operation of forming the first copper layer 502. For example, the operation of forming the first carbon-rich copper layer 504 may include introducing the suppressor having a concentration ranging from about 3M to about 8M, and the leveling agent having a concentration ranging from about 2M to about 10M. In some exemplary examples, a ratio of concentrations of the accelerator, the suppressor and the leveling agent introduced in the operation of forming the first carbon-rich copper layer 312 is about 6:3:2. The plating tank used to form the first carbon-rich copper layer 504 may be different from the plating tank used to form the first copper layer 502.

The operation of forming the first carbon-rich copper layer 504 includes forming the first carbon-rich copper layer 504 having a carbon concentration greater than a carbon concentration of the first copper layer 502. In some examples, a ratio of the carbon concentration of the first carbon-rich copper layer 504 to the carbon concentration of the first copper layer 502 is greater than about 1.5.

In some examples, the operation of forming the first carbon-rich copper layer 504 includes forming the first carbon-rich copper layer 504 having a thickness 506 ranging from about 50 angstrom to about 4000 angstrom. The operation of forming the first carbon-rich copper layer 504 includes forming the first carbon-rich copper layer 504 having a top surface 508 and a bottom surface 510 opposite to the top surface 508. In some exemplary examples, the bottom surface 510 of the first carbon-rich copper layer 504 is spaced from a bottom surface 512 of the first copper layer 502 at a distance 514 greater than or equal to about 1000 angstrom.

Figure 6C:
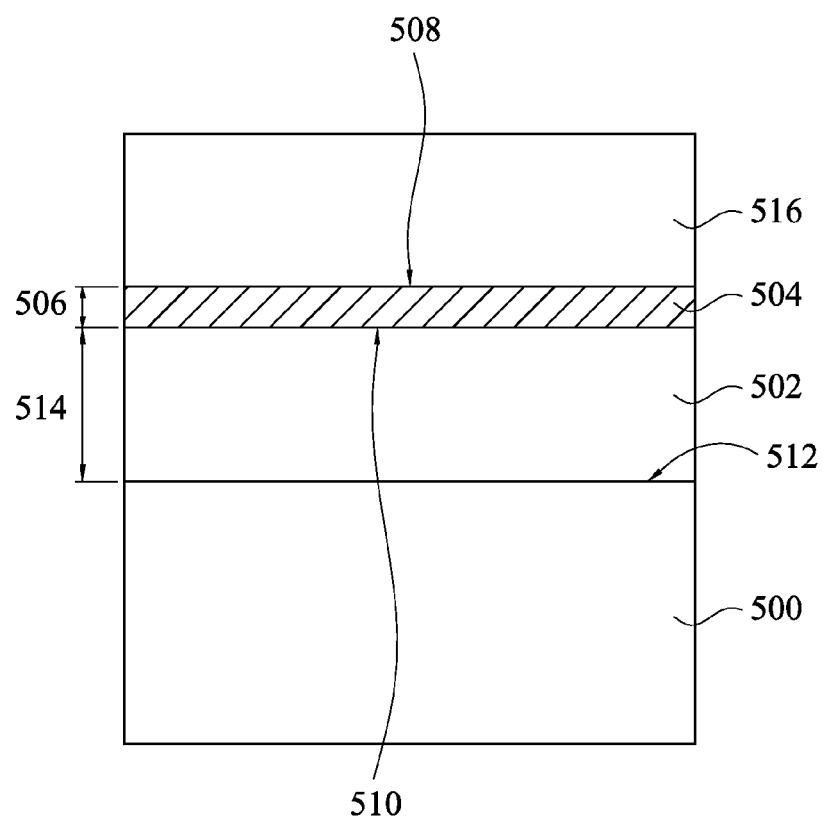

As shown in FIG. 6C, a second copper layer 516 is formed on the top surface 508 of the first carbon-rich copper layer 504 using, for example, an electroplating technique. In some examples, the operation of forming the second copper layer 516 includes introducing an accelerator, a suppressor and a leveling agent into a plating tank to form the second copper layer 516. The accelerator, the suppressor and the leveling agent introduced in the operation of forming the second copper layer 516 may be respectively the same as the accelerator, the suppressor and the leveling agent introduced in the operation of forming the first copper layer 502 or the first carbon-rich copper layer 504. In some exemplary examples, a ratio of concentrations of the accelerator, the suppressor and the leveling agent introduced in the operation of forming the second copper layer 516 is about 6:1.5:1. The plating tank used to form the second copper layer 516 may be the same as the plating tank used to form the first copper layer 502, and may be different from the plating tank used to form the first carbon-rich copper layer 504.

The operation of forming the second copper layer 516 includes forming the second copper layer 516 having a carbon concentration smaller than the carbon concentration of the first carbon-rich copper layer 504. In some examples, a ratio of the carbon concentration of the first carbon-rich copper layer 504 to the carbon concentration of the second copper layer 516 is greater than about 1.5. The carbon concentration of the first copper layer 502 may be equal to the carbon concentration of the second copper layer 516. Alternatively, the carbon concentration of the first copper layer 502 may be different from the carbon concentration of the second copper layer 516.

Figure 6D:
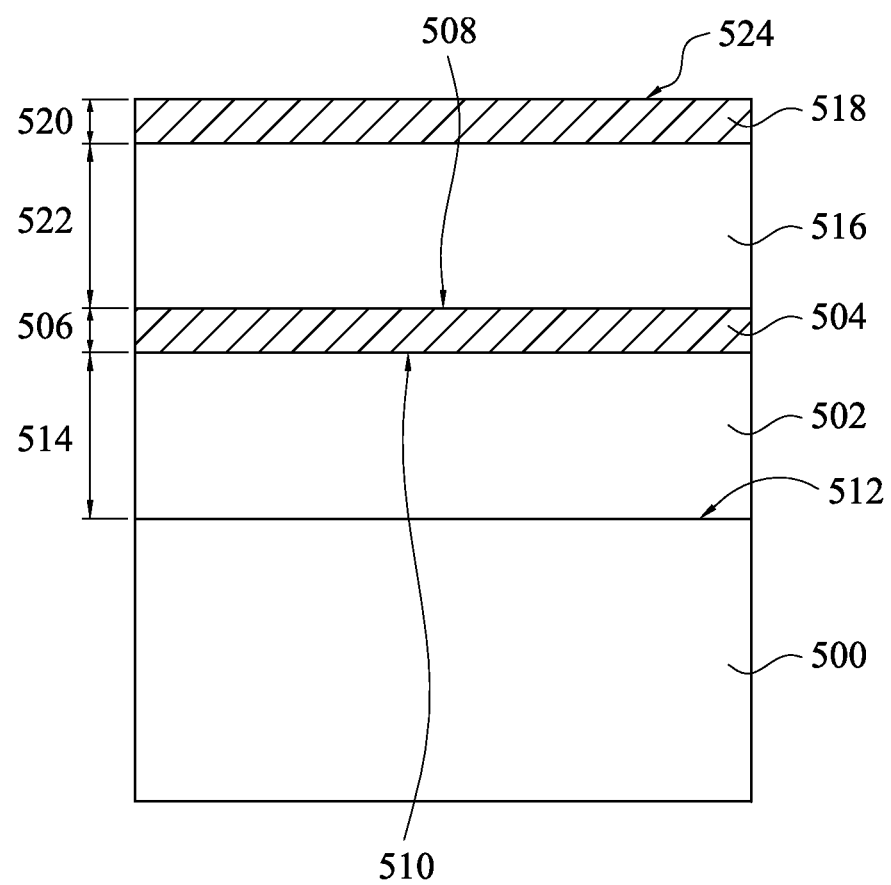

As shown in FIG. 6D, a second carbon-rich copper layer 518 is formed over the second copper layer 516 using, for example, an electroplating technique. In some examples, the operation of forming the second carbon-rich copper layer 518 includes introducing an accelerator, a suppressor and a leveling agent into a plating tank to form the second carbon-rich copper layer 518. The accelerator, the suppressor and the leveling agent introduced in the operation of forming the second carbon-rich copper layer 518 may be respectively the same as the accelerator, the suppressor and the leveling agent introduced in the operation of forming the first copper layer 502, the second copper layer 516 and the first carbon-rich copper layer 504. For example, the operation of forming the second carbon-rich copper layer 518 may include introducing the suppressor having a concentration ranging from about 3M to about 8M, and the leveling agent having a concentration ranging from about 2M to about 10M. In some exemplary examples, a ratio of concentrations of the accelerator, the suppressor and the leveling agent introduced in the operation of forming the second carbon-rich copper layer 518 is about 6:3:2. The plating tank used to form the second carbon-rich copper layer 518 may be the same as the plating tank used to form the first carbon-rich copper layer 504, and may be different from the plating tank used to form the first copper layer 502 or the second copper layer 516.

The operation of forming the second carbon-rich copper layer 518 includes forming the second carbon-rich copper layer 518 having a carbon concentration greater than the carbon concentration of the first copper layer 502 and the carbon concentration of the second copper layer 516. In some examples, a ratio of the carbon concentration of the second carbon-rich copper layer 518 to the carbon concentration of the first copper layer 502 or the carbon concentration of the second copper layer 516 is greater than about 1.5. The carbon concentration of the second carbon-rich copper layer 518 may be equal to the carbon concentration of the first carbon-rich copper layer 504. Alternatively, the carbon concentration of the second carbon-rich copper layer 518 may be different from the carbon concentration of the first carbon-rich copper layer 504.

In some examples, the operation of forming the second carbon-rich copper layer 518 includes forming the second carbon-rich copper layer 518 having a thickness 520 ranging from about 50 angstrom to about 4000 angstrom. The thickness 520 of the second carbon-rich copper layer 518 may be equal to the thickness 506 of the first carbon-rich copper layer 504. Alternatively, the thickness 520 of the second carbon-rich copper layer 518 may be different from the thickness 506 of the first carbon-rich copper layer 504. In some exemplary examples, a gap 522 between the second carbon-rich copper layer 518 and the first carbon-rich copper layer 504 is greater than or equal to about 4000 angstrom.

Figure 6E:
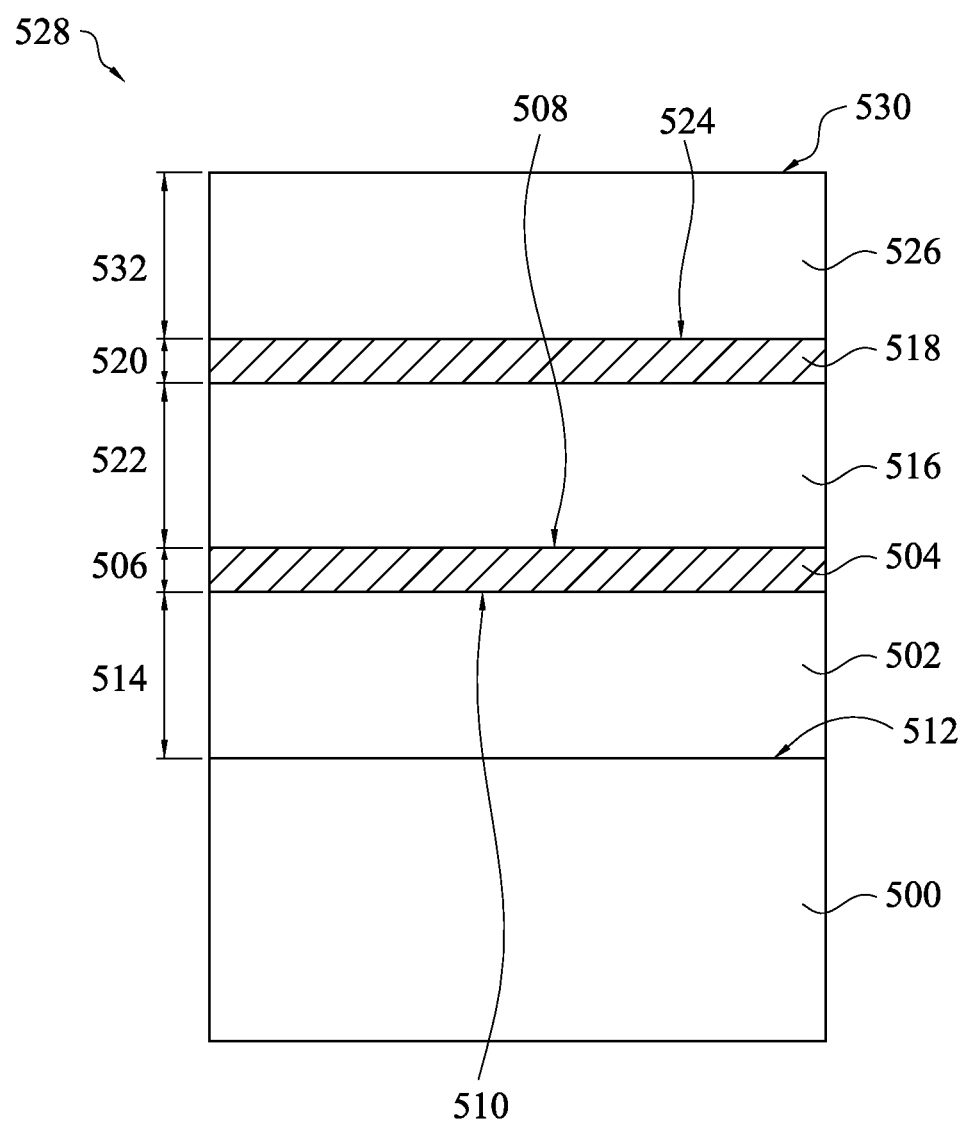

As shown in FIG. 6E, a third copper layer 526 is formed on a top surface 524 of the second carbon-rich copper layer 518 using, for example, an electroplating technique, so as to complete the formation of a copper layer structure 528. In some examples, the operation of forming the third copper layer 526 includes introducing an accelerator, a suppressor and a leveling agent into a plating tank to form the third copper layer 526. The accelerator, the suppressor and the leveling agent introduced in the operation of forming the third copper layer 526 may be respectively the same as the accelerator, the suppressor and the leveling agent introduced in the operation of forming the first copper layer 502, the second copper layer 516, the first carbon-rich copper layer 504 or the second carbon-rich copper layer 518. In some exemplary examples, a ratio of concentrations of the accelerator, the suppressor and the leveling agent introduced in the operation of forming the third copper layer 526 is about 6:1.5:1. The plating tank used to form the third copper layer 526 may be the same as the plating tank used to form the first copper layer 502 and the second copper layer 516, and may be different from the plating tank used to form the first carbon-rich copper layer 504 and the second carbon-rich copper layer 518.

The operation of forming the third copper layer 526 includes forming the third copper layer 526 having a carbon concentration smaller than the carbon concentration of the first carbon-rich copper layer 504 and the second carbon-rich copper layer 518. In some examples, a ratio of the carbon concentration of each of the first carbon-rich copper layer 504 and the second carbon-rich copper layer 518 to the carbon concentration of the third copper layer 526 is greater than about 1.5. The carbon concentration of the third copper layer 526 may be equal to the carbon concentration of the second copper layer 516 and/or the first copper layer 502. Alternatively, the carbon concentration of the third copper layer 526 may be different from the carbon concentration of the second copper layer 516 and/or the first copper layer 502.

The operation of forming the third copper layer 526 includes forming the third copper layer 526 having a top surface 530. In some exemplary examples, the top surface 530 of the third copper layer 526, which is the top one among the first copper layer 502, the second copper layer 516 and the third copper layer 526, is spaced from the top surface 524 of the second carbon-rich copper layer 518, which is the top one between the first carbon-rich copper layer 504 and the second carbon-rich copper layer 518, at a distance 532 greater than or equal to about 1000 angstrom.

With the first carbon-rich copper layer 504 and the second carbon-rich copper layer 518 respectively separating the first copper layer 502 from the second copper layer 516 and separating the second copper layer 516 from the third copper layer 526, the growth and agglomeration of copper grains in the first copper layer 502, the second copper layer 516 and the third copper layer 526 can be blocked or eliminated, such that strain of the first copper layer 502, the second copper layer 516 and the third copper layer 526 is decreased, thereby preventing hump defects and pit defects from occurring in the copper layer structure 528.

Figure 7:
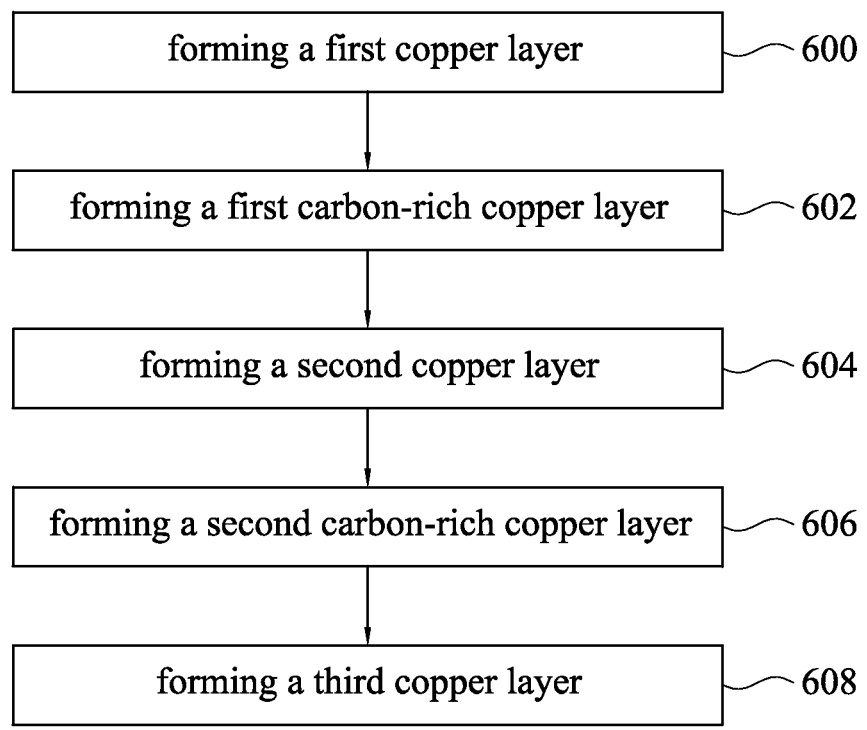
FIG. 7 is a flow chart of a method for manufacturing a semiconductor device in accordance with various embodiments.

Referring to FIG. 7 with FIG. 6A through FIG. 6E, FIG. 7 is a flow chart of a method for manufacturing a semiconductor device in accordance with various embodiments. The method begins at operation 600, where a substrate 500 is provided. The substrate 500 may be a semiconductor substrate, such as a silicon substrate. The substrate 500 may be a multi-layered structure including various circuit layers. A first copper layer 502 is formed on the substrate 500 using, for example, an electroplating technique. In some examples, the operation of forming the first copper layer 502 includes introducing an accelerator, a suppressor and a leveling agent into a plating tank to form the first copper layer 310. A ratio of concentrations of the accelerator, the suppressor and the leveling agent introduced in the operation of forming the first copper layer may be about 6:1.5:1.

At operation 602, as shown in FIG. 6B, a first carbon-rich copper layer 504 is formed over the first copper layer 502 using, for example, an electroplating technique. In some examples, the operation of forming the first carbon-rich copper layer 504 includes introducing an accelerator, a suppressor and a leveling agent into a plating tank to form the first carbon-rich copper layer 504. The accelerator, the suppressor and the leveling agent introduced in the operation of forming the first carbon-rich copper layer 504 may be respectively the same as the accelerator, the suppressor and the leveling agent introduced in the operation of forming the first copper layer 502. For example, the operation of forming the first carbon-rich copper layer 504 may include introducing the suppressor having a concentration ranging from about 3M to about 8M, and the leveling agent having a concentration ranging from about 2M to about 10M. A ratio of concentrations of the accelerator, the suppressor and the leveling agent introduced in the operation of forming the first carbon-rich copper layer 312 may be about 6:3:2.

The operation of forming the first carbon-rich copper layer 504 includes forming the first carbon-rich copper layer 504 having a carbon concentration greater than a carbon concentration of the first copper layer 502. A ratio of the carbon concentration of the first carbon-rich copper layer 504 to the carbon concentration of the first copper layer 502 may be greater than about 1.5. In some examples, the operation of forming the first carbon-rich copper layer 504 includes forming the first carbon-rich copper layer 504 having a thickness 506 ranging from about 50 angstrom to about 4000 angstrom. In some exemplary examples, a bottom surface 510 of the first carbon-rich copper layer 504 is spaced from a bottom surface 512 of the first copper layer 502 at a distance 514 greater than or equal to about 1000 angstrom.

At operation 604, as shown in FIG. 6C, a second copper layer 516 is formed on a top surface 508 of the first carbon-rich copper layer 504 using, for example, an electroplating technique. The operation of forming the second copper layer 516 may include introducing an accelerator, a suppressor and a leveling agent into a plating tank to form the second copper layer 516. The accelerator, the suppressor and the leveling agent introduced in the operation of forming the second copper layer 516 may be respectively the same as the accelerator, the suppressor and the leveling agent introduced in the operation of forming the first copper layer 502 or the first carbon-rich copper layer 504. In some exemplary examples, a ratio of concentrations of the accelerator, the suppressor and the leveling agent introduced in the operation of forming the second copper layer 516 is about 6:1.5:1.

The operation of forming the second copper layer 516 includes forming the second copper layer 516 having a carbon concentration smaller than the carbon concentration of the first carbon-rich copper layer 504. In some examples, a ratio of the carbon concentration of the first carbon-rich copper layer 504 to the carbon concentration of the second copper layer 516 is greater than about 1.5. The carbon concentration of the first copper layer 502 may be equal to the carbon concentration of the second copper layer 516. Alternatively, the carbon concentration of the first copper layer 502 may be different from the carbon concentration of the second copper layer 516.

At operation 606, as shown in FIG. 6D, a second carbon-rich copper layer 518 is formed over the second copper layer 516 using, for example, an electroplating technique. The operation of forming the second carbon-rich copper layer 518 may include introducing an accelerator, a suppressor and a leveling agent into a plating tank to form the second carbon-rich copper layer 518. The accelerator, the suppressor and the leveling agent introduced in the operation of forming the second carbon-rich copper layer 518 may be respectively the same as the accelerator, the suppressor and the leveling agent introduced in the operation of forming the first copper layer 502, the second copper layer 516 and the first carbon-rich copper layer 504. For example, the operation of forming the second carbon-rich copper layer 518 may include introducing the suppressor having a concentration ranging from about 3M to about 8M, and the leveling agent having a concentration ranging from about 2M to about 10M. A ratio of concentrations of the accelerator, the suppressor and the leveling agent introduced in the operation of forming the second carbon-rich copper layer 518 may be about 6:3:2.

The operation of forming the second carbon-rich copper layer 518 includes forming the second carbon-rich copper layer 518 having a carbon concentration greater than the carbon concentration of the first copper layer 502 and the carbon concentration of the second copper layer 516. In some examples, a ratio of the carbon concentration of the second carbon-rich copper layer 518 to the carbon concentration of the first copper layer 502 or the carbon concentration of the second copper layer 516 is greater than about 1.5. The carbon concentration of the second carbon-rich copper layer 518 may be equal to the carbon concentration of the first carbon-rich copper layer 504. Alternatively, the carbon concentration of the second carbon-rich copper layer 518 may be different from the carbon concentration of the first carbon-rich copper layer 504.

In some examples, the operation of forming the second carbon-rich copper layer 518 includes forming the second carbon-rich copper layer 518 having a thickness 520 ranging from about 50 angstrom to about 4000 angstrom. The thickness 520 of the second carbon-rich copper layer 518 may be equal to the thickness 506 of the first carbon-rich copper layer 504. Alternatively, the thickness 520 of the second carbon-rich copper layer 518 may be different from the thickness 506 of the first carbon-rich copper layer 504. In some exemplary examples, a gap 522 between the second carbon-rich copper layer 518 and the first carbon-rich copper layer 504 is greater than or equal to about 4000 angstrom.

At operation 608, as shown in FIG. 6E, a third copper layer 526 is formed on a top surface 524 of the second carbon-rich copper layer 518 using, for example, an electroplating technique, so as to complete the formation of a copper layer structure 528. The operation of forming the third copper layer 526 may include introducing an accelerator, a suppressor and a leveling agent into a plating tank to form the third copper layer 526. The accelerator, the suppressor and the leveling agent introduced in the operation of forming the third copper layer 526 may be respectively the same as the accelerator, the suppressor and the leveling agent introduced in the operation of forming the first copper layer 502, the second copper layer 516, the first carbon-rich copper layer 504 or the second carbon-rich copper layer 518. A ratio of concentrations of the accelerator, the suppressor and the leveling agent introduced in the operation of forming the third copper layer 526 may be about 6:1.5:1.

The operation of forming the third copper layer 526 includes forming the third copper layer 526 having a carbon concentration smaller than the carbon concentration of the first carbon-rich copper layer 504 and the second carbon-rich copper layer 518. In some examples, a ratio of the carbon concentration of each of the first carbon-rich copper layer 504 and the second carbon-rich copper layer 518 to the carbon concentration of the third copper layer 526 is greater than about 1.5. The carbon concentration of the third copper layer 526 may be equal to the carbon concentration of the second copper layer 516 and/or the first copper layer 502. Alternatively, the carbon concentration of the third copper layer 526 may be different from the carbon concentration of the second copper layer 516 and/or the first copper layer 502.

In some exemplary examples, a top surface 530 of the third copper layer 526, which is the top one among the first copper layer 502, the second copper layer 516 and the third copper layer 526, is spaced from the top surface 524 of the second carbon-rich copper layer 518, which is the top one between the first carbon-rich copper layer 504 and the second carbon-rich copper layer 518, at a distance 532 greater than or equal to about 1000 angstrom.

In accordance with an embodiment, the present disclosure discloses a copper layer structure. The copper layer structure includes a first copper layer, a second copper layer and a carbon-rich copper layer. The second copper layer is disposed over the first copper layer. The carbon-rich copper layer is sandwiched between the first copper layer and the second copper layer. A carbon concentration of the carbon-rich copper layer is greater than a carbon concentration of the first copper layer and a carbon concentration of the second copper layer.

In accordance with another embodiment, the present disclosure discloses a copper layer structure. The copper layer structure includes a copper main layer and at least one carbon-rich copper layer. The at least one carbon-rich copper layer is arranged in the copper main layer to divide the copper main layer into at least two copper layers. A carbon concentration of the at least one carbon-rich copper layer is greater than a carbon concentration of the copper main layer.

In accordance with yet another embodiment, the present disclosure discloses a method for forming a copper layer structure. In this method, a first copper layer is formed on a substrate. A carbon-rich copper layer is formed over the first copper layer. A second copper layer is formed over the carbon-rich copper layer. The operation of forming the carbon-rich copper layer includes forming the carbon-rich copper layer having a carbon concentration greater than a carbon concentration of the first copper layer and a carbon concentration of the second copper layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A copper layer structure, comprising:
    a substrate;
    a dielectric layer disposed on a surface of the substrate, wherein the dielectric layer has a via hole and a trench that is disposed over and communicates with the via hole, and the via hole and the trench pass through the dielectric layer, and the trench comprises a first portion, a second portion, and a third portion sequentially located over the via hole;
    a first copper layer filling the via hole and said first portion of the trench;
    a second copper layer disposed over the first copper layer and filling said third portion of the trench; and
    a carbon-rich copper layer filling said second portion and sandwiched between the first copper layer and the second copper layer, wherein a carbon concentration of the carbon-rich copper layer is greater than a carbon concentration of the first copper layer and a carbon concentration of the second copper layer, and the carbon concentration of the first copper layer is equal to the carbon concentration of the second copper layer.

2. The copper layer structure of claim 1, wherein the carbon-rich copper layer has a thickness ranging from 50 angstrom to 4000 angstrom.

3. The copper layer structure of claim 1, wherein a distance between a top surface of the carbon-rich copper layer and a top surface of the second copper layer is greater than or equal to 1000 angstrom.

4. The copper layer structure of claim 1, wherein a distance between a bottom surface of the carbon-rich copper layer and a bottom surface of the first copper layer is greater than or equal to 1000 angstrom.

5. The copper layer structure of claim 1, wherein a ratio of the carbon concentration of the carbon-rich copper layer to the carbon concentration of the first copper layer or the carbon concentration of the second copper layer is greater than 1.5.

6. The copper layer structure of claim 1, wherein
    the first copper layer comprises a first surface and a second surface opposite to the first surface, wherein the first surface contacts the surface of the substrate, and the carbon concentration of the first copper layer is nonzero; and
    the carbon-rich copper layer comprises a third surface and a fourth surface opposite to the third surface, wherein the third surface contacts the second surface of the first copper layer.

7. The copper layer structure of claim 6, wherein the second copper layer comprises a fifth surface and a sixth surface opposite to the fifth surface, wherein the fifth surface contacts the fourth surface of the carbon-rich copper layer, and the carbon concentration of the second copper layer is nonzero.

8. A copper layer structure, comprising:
    a substrate comprising a dielectric layer, wherein the dielectric layer has a via hole and a trench that is disposed over and communicates with the via hole, and the via hole and the trench pass through the dielectric layer, and the trench comprises at least three portions sequentially located over the via hole;
    at least two copper layers, wherein a lowest one of the copper layers fills the via hole and a lowest one of said portions of the trench, and a top one of the copper layers fills a top one of said portions of the trench; and at least one carbon-rich copper layer arranged between the copper layers to separate the copper layers from each other, wherein a lowest one of the at least one carbon-rich copper layer fills one of said portions of the trench which is next to the lowest one of said portions of the trench, and the lowest one of the at least one carbon-rich copper layer is disposed on the lowest one of the copper layers, wherein a carbon concentration of the at least one carbon-rich copper layer is greater than a carbon concentration of each of the copper layers, and the carbon concentrations of the copper layers are equal to each other.

9. The copper layer structure of claim 8, wherein the number of the at least one carbon-rich copper layer is one, and the number of the copper layers is two.

10. The copper layer structure of claim 8, wherein the number of the at least one carbon-rich copper layer is more than one, the carbon-rich copper layers are separated from each other, and the number of the copper layers is equal to the number of the at least one carbon-rich copper layer plus one.

11. The copper layer structure of claim 10, wherein a gap between any adjacent two of the carbon-rich copper layers is greater than or equal to 4000 angstrom.

12. The copper layer structure of claim 10, wherein a distance between a top surface of a top one of the carbon-rich copper layers and a top surface of the top one of the copper layers is greater than or equal to 1000 angstrom.

13. The copper layer structure of claim 10, wherein a distance between a bottom surface of the lowest one of the carbon-rich copper layers and a bottom surface of the lowest one of the copper layers is greater than or equal to 1000 angstrom.

14. The copper layer structure of claim 10, wherein each of the carbon-rich copper layers has a thickness ranging from 50 angstrom to 4000 angstrom.

15. The copper layer structure of claim 8, wherein a ratio of the carbon concentration of the at least one carbon-rich copper layer to the carbon concentration of each of the copper layers is greater than 1.5.

16. A copper layer structure, comprising:
a substrate comprising a circuit layer and a dielectric layer stacked on the circuit layer, wherein the dielectric layer has a via hole and a trench that is disposed over and communicates with the via hole, and the via hole and the trench pass through the dielectric layer to expose a portion of the circuit layer, and the trench comprises a first portion, a second portion, and a third portion sequentially located over the via hole;

a first copper layer filling the via hole and said first portion and contacting said portion of the circuit layer;

a carbon-rich copper layer disposed on and contacting the first copper layer and filling said second portion, wherein the carbon-rich copper layer contacts a sidewall of the trench; and a second copper layer disposed on and contacting the carbon-rich copper layer and filling said third portion, wherein the second copper layer contacts the sidewall of the trench, and a carbon concentration of the carbon-rich copper layer is greater than a carbon concentration of the first copper layer and a carbon concentration of the second copper layer, and the carbon concentration of the first copper layer is equal to the carbon concentration of the second copper layer.

17. The copper layer structure of claim 16, wherein the carbon concentration of the first copper layer is equal to the carbon concentration of the second copper layer.

18. The copper layer structure of claim 16, wherein
a distance between a top surface of the carbon-rich copper layer and a top surface of the second copper layer is greater than or equal to 1000 angstrom; and
a distance between a bottom surface of the carbon-rich copper layer and a bottom surface of the first copper layer is greater than or equal to 1000 angstrom.

19. The copper layer structure of claim 16, wherein the carbon-rich copper layer has a thickness ranging from 50 angstrom to 4000 angstrom.

20. The copper layer structure of claim 16, wherein a ratio of the carbon concentration of the carbon-rich copper layer to the carbon concentration of the first copper layer or the carbon concentration of the second copper layer is greater than 1.5.

* * * * *